United States Patent [19]
Mathuni

[11] Patent Number: 6,013,136
[45] Date of Patent: Jan. 11, 2000

[54] APPARATUS FOR PLASMA-SUPPORTED BACK ETCHING OF A SEMICONDUCTOR WAFER

[75] Inventor: Josef Mathuni, Munich, Germany

[73] Assignee: Siemens Aktiengesellschaft, Munich, Germany

[21] Appl. No.: 08/764,703

[22] Filed: Dec. 2, 1996

Related U.S. Application Data

[63] Continuation of application No. 08/392,073, Feb. 22, 1995.

[30] Foreign Application Priority Data

Feb. 22, 1994 [DE] Germany ............................ 44 05 667
Jan. 25, 1995 [DE] Germany ........................... 195 02 777

[51] Int. Cl.[7] ................................................. C23C 16/00
[52] U.S. Cl. ....................... 118/728; 118/723 R; 156/345
[58] Field of Search ....................... 118/723 R, 723 MW, 118/723 ME, 723 MR, 723 MA, 723 AN, 723 E, 723 I, 723 IR, 728; 156/345; 204/298.15

[56] References Cited

U.S. PATENT DOCUMENTS

| | | | |
|---|---|---|---|
| 4,350,562 | 9/1982 | Bonü ..................................... | 156/639 |
| 4,857,142 | 8/1989 | Syverson . | |
| 5,075,256 | 12/1991 | Wang et al. ............................. | 437/225 |
| 5,224,998 | 7/1993 | Ohmi et al. ............................. | 118/720 |
| 5,230,741 | 7/1993 | van de Ven et al. .................... | 118/728 |
| 5,238,499 | 8/1993 | van de Ven et al. .................... | 118/724 |
| 5,269,847 | 12/1993 | Anderson et al. ....................... | 118/715 |
| 5,280,894 | 1/1994 | Witcraft et al. . | |
| 5,292,554 | 3/1994 | Sinha et al. ............................. | 427/251 |
| 5,611,865 | 3/1997 | White et al. ............................. | 118/725 |
| 5,711,815 | 1/1998 | Lee et al. ................................ | 118/725 |

FOREIGN PATENT DOCUMENTS 0 414 038 A2  2/1991  European Pat. Off. .

OTHER PUBLICATIONS

Patents Abstracts of Japan, vol. 134 E 115: JP–A–3–228321 (NEC) Oct. 9, 1991.
Patents Abstracts of Japan, E–1368 May 20, 1993, vol. 17, No. 257: JP–A–5–3176 (NEC) Jan. 8, 1993.
Patents Abstracts of Japan, E–1133 Mar. 18, 1993, vol. 17, No. 128: JP–A–4–302422 (NEC) Oct. 26, 1992.
Patents Abstracts of Japan, E–1173 Mar. 4, 1992, vol. 16, No. 88: JP–A–3–272140 (Fujitsu) Dec. 3, 1991.
Patents Abstracts of Japan, vol. 60 E 1520: JP–A–5–326453 Dec. 10, 1992.
Patent Abstract of Japan No. 63/202922 (A) Yanabe Aug. 22, 1988.
Patent Abstract of Japan No. 63/94630 (A) Tsuji Apr. 25, 1988.
Research Disclosure Publ. Feb. 1986, No. 26238, p. 98, Backside Etch of Silicon Nitride on Device . . . .
"Etching of Thin $SiO_2$ layers using wet HF Gas" (Van der Heide et al.), 8257 Journal of Vacuum Science & Technology, May/Jun. 1989, No. 3, Part II, New York, pp. 1719–1723.
Patent Abstract of Japan No. 0 531 5300 (Yasayuki), dated Nov. 26, 1994.
Patent Abstract of Japan No. 0 322 8321 (Tsuneo), dated Oct. 9, 1991.

*Primary Examiner*—Bruce Breneman
*Assistant Examiner*—Luz Alejandro
*Attorney, Agent, or Firm*—Herbert L. Lerner; Laurence A. Greenberg

[57] ABSTRACT

A method for the manufacture of highly-integrated circuits on a semiconductor substrate includes applying coatings to front and back sides of a wafer of semiconductor material in at least one deposition process, and subsequently removing the coating on the back of the wafer by etching being carried out with the front of the wafer being free of lacquer. The etching is performed in a process chamber in which reactive particles produced in a plasma only reach the back of the wafer, while advances of the reactive particles toward the front of the wafer are prevented by a protective neutral gas.

6 Claims, 2 Drawing Sheets

6,013,136

APPARATUS FOR PLASMA-SUPPORTED BACK ETCHING OF A SEMICONDUCTOR WAFER

This application is a continuation of application Ser. No. 08/392,073, filed on Feb. 22, 1995.

BACKGROUND OF THE INVENTION

1. Field of the Invention

The invention relates to a method for the manufacture of highly integrated circuits on a semiconductor substrate in which a wafer of semiconductor material is coated on both sides by at least one deposition process and in which the coating on the back of the wafer is subsequently removed again by etching being carried out with the front of the wafer being free of lacquer.

During the manufacturing process of the semiconductor components, the wafers, which are normally formed of silicon, are subjected again and again to deposition processes during which the wafers are coated on both sides depending on the method and/or on the system. They are essentially oxidations (thermal oxide), as well as CVD (chemical vapor deposition) processes (polysilicon doped and undoped, silicon dioxide, silicon nitride). Since the build up of several different layers on the back of the wafer is not desired and can lead to adverse effects on other processes, etching steps are carried out on the back during the course of the entire production process. The way that usually occurs is that the front is lacquered over its entire surface and afterward the current layer on the back of the wafer is removed again by means of a wet or dry etching procedure. The Tokuda CDE 7, CDE 8 or Gasonics IPC are used, for example, as the plasma etching equipment. Thereafter, the lacquer on the front of the wafer has to be removed again. The additional step of coating and removing the coating from the front of the wafer that occurs in that back etching known in the art requires processing time, system capacity (lacquering line, lacquer removal basins or $O_2$-plasma stripper, and cleaning), as well as use of a considerable amount of chemicals.

In the meantime, however, another etching method on a wet chemical basis which has become known in the art is carried out without front lacquering. The manufacturer of that equipment (RST-100) is the firm SEZ in Villach, Austria. In that method, the silicon wafers, which are already provided with structures for the most part, are turned quickly with their surfaces, in other words the fronts of the wafers, facing downward on a rotating air cushion, while the wet-chemical etching solution flows down on the back of the wafer. The quick rotation of the wafer causes the chemicals to be spun out over the edge of the back of the wafer and they therefore cannot come in contact with the front side.

However, that known method is connected with considerable problems since, on one hand, the requirement of rotating a semi-processed silicon wafer with its surface downward on an air cushion safe from contact and the damage associated with it requires a complicated and therefore vulnerable mechanical system. On the other hand, blowing on the open front side of the wafer in semiconductor production is normally to be avoided as far as possible to prevent particulate pollution resulting from the turbulence processes. Moreover, the amount of chemicals consumed in that known method is naturally very high, since due to the spinning process on the back of the wafer, a continuous flow is necessary. However, high chemical consumption should be avoided due to environmental reasons.

SUMMARY OF THE INVENTION

It is accordingly an object of the invention to provide a method for plasma-supported back etching of a semiconductor wafer with the front of the wafer being free of lacquer, which overcomes the hereinbefore-mentioned disadvantages of the heretofore-known methods of this general type and which permits etching of the back of a wafer without coating and removing a coating from the front.

With the foregoing and other objects in view there is provided, in accordance with the invention, a method for the manufacture of highly-integrated circuits on a semiconductor substrate, which comprises applying coatings to front and back sides of a wafer of semiconductor material in at least one deposition process; subsequently removing the coating on the back of the wafer by etching being carried out with the front of the wafer being free of lacquer; and performing the etching in a process chamber in which reactive particles produced in a plasma only reach the back of the wafer, while advances of the reactive particles toward the front of the wafer are prevented by a protective neutral gas.

In accordance with another mode of the invention, there is provided a method which comprises adjusting a pressure of the neutral gas acting on the front of the wafer to be at least as high as a pressure acting on the back of the wafer.

In accordance with a further mode of the invention, there is provided a method which comprises protecting the front of the wafer with a flow of the neutral gas over it.

In accordance with an added mode of the invention, there is provided a method which comprises at least partially sealing a first part of the process chamber containing the back of the wafer against a second part of the process chamber containing the front of the wafer.

In accordance with an additional mode of the invention, there is provided a method which comprises forming the seal through profile adjustment of a seating area of the process chamber to a flat region of the wafer.

In accordance with yet another mode of the invention, there is provided a method which comprises forming the partial seal with a ring diaphragm located in an outer edge region of the front of the wafer.

In accordance with yet a further mode of the invention, there is provided a method which comprises placing the ring diaphragm at a distance of at most a few millimeters from the wafer or if possible keeping the ring diaphragm free from contact with the wafer.

In accordance with yet an added mode of the invention, there is provided a method which comprises holding the ring diaphragm and the wafer completely free of contact relative to each other for the front of the wafer by using an indirect limit stop.

In accordance with yet an additional mode of the invention, there is provided a method which comprises etching with an etching gas, and using the etching gas without excitation or energizing as the neutral gas.

In accordance with again another mode of the invention, there is provided a method which comprises using nitrogen as the neutral gas.

In accordance with a concomitant mode of the invention, there is provided a method which comprises etching in a single-wafer etcher with the front of the wafer facing upward in a horizontal position.

Other features which are considered as characteristic for the invention are set forth in the appended claims.

Although the invention is illustrated and described herein as embodied in a method for plasma-supported back etching of a semiconductor wafer with the front of the wafer being free of lacquer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In accordance with the invention, the layers to be removed from the back of the wafer can be etched, in particular, with a microwave-frequency or high frequency energized chemical downstream process using fluorine compounds, without having to modify the actual back etching process. However, protection of the front of the wafer no longer occurs through lacquering or enamelling and then removing the lacquer, but rather occurs by using a neutral gas. The protective effect of the neutral gas can be supported by an appropriate construction of a process chamber and appropriate process handling. An advantage of the method according to the invention is, above all, the ability to fully automatically transport the silicon wafer into the process chamber in its natural position, thus with its surface facing upward, according to the conventional methods for single wafer etchers.

Figure 1:
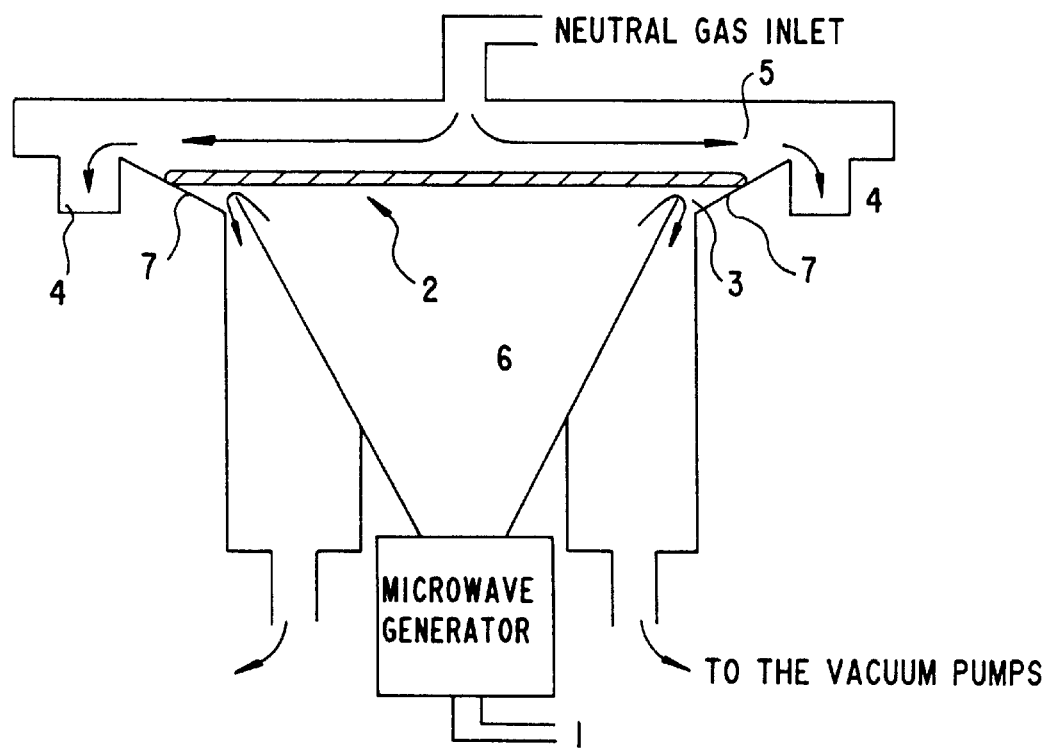
FIG. 1 is a fragmentary, diagrammatic, longitudinal-sectional view of a seal for a single-wafer etching system suitable for conducting the method according to the invention.

Referring now to the figures of the drawing in detail and first, particularly, to FIG. 1 thereof, there are seen parts of a single wafer etcher in which reactive particles of an admitted etching gas 1 reach up to the back of a wafer 2 during back etching. The reactive particles can then be suctioned off along with etching products, for example, through a ring-shaped gap 3 located below the edge of the wafer. During the etching process, the upper surface of the wafer is protected by a non-etching neutral gas. Nitrogen can be used, for example, or the non-energized etching gas itself, for example $CF_4$ or $NF_3$.

The neutral gas can, for example, be admitted over the center of the wafer and suctioned off over the edge of the wafer through a ring pipe 4, as is shown in FIG. 1. However, in order to provide the protective effect of the neutral gas, a flow of gas is not absolutely required.

Figure 2:
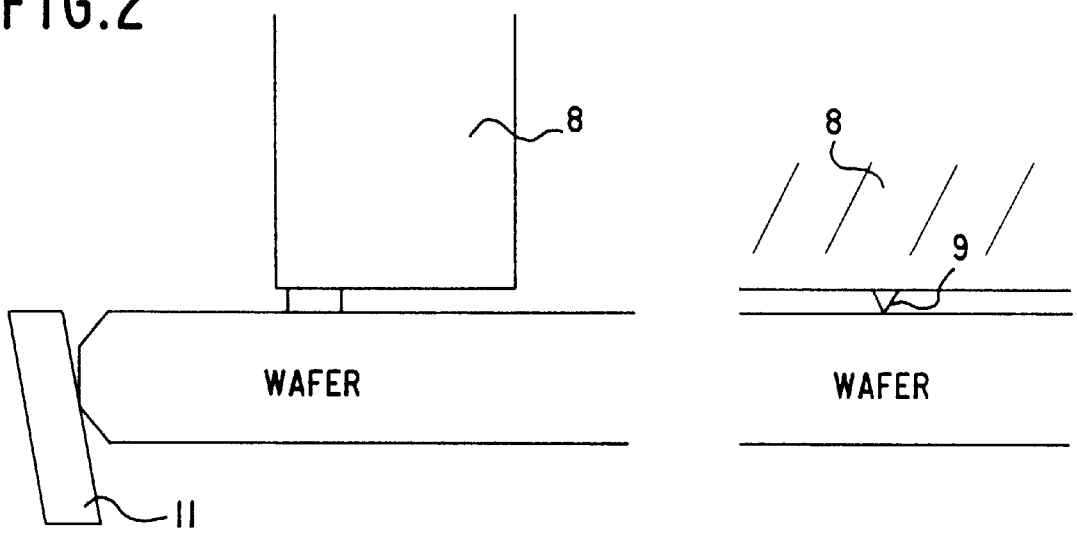
FIG. 2 includes fragmentary, side-elevational and front-elevational views of a wafer being held in a position.

It is advantageous if the pressure in an upper part 5 of the process chamber is at least as high as that in a lower part 6 of the process chamber. On one hand, this prevents unintended lifting of the wafer, while at the same time the overpressure over the wafer causes the flow of gas to always occur from above toward the bottom in the case of leakage in a seating area 7 of the edge of the wafer. As a result, penetration of energized etching particles into the upper part 5 of the process chamber and therefore etching of the upper surface of the wafer is prevented. On the other hand, any possible penetration of neutral gas into the lower part 6 of the process chamber resulting therefrom results in only slight dilution of the etching gas, through which only a negligible increase in the inhomogeneities of the etching rates become apparent. In addition, location of the ring-shaped gap 3 at the edge of the wafer guarantees that the neutral gas that has penetrated can be pumped away quickly. Of course, the formation of leakages should be suppressed as much as possible through proper profile adjustment of the seating surface in the flat area of the wafer or through flush seals. The slope of the seating area 7 shown in FIG. 1 allows etching to occur up to the edge of the wafer. With a similar form and/or slope selected for the seating area 7, targeted etching well into the edge of the wafer is possible. However, the seal of the two parts of the process chamber can also be formed from above, such as with a cylinder attached to the outer edge of the front of the wafer. All told, it is also perfectly within the scope of the invention to have the outer edge of the front of the wafer etched back to a desired degree, at most a few millimeters. To be precise, this shall be performed in the following way:

As is seen in FIG. 2, in its natural position (back facing downward), the wafer is pressed up against a ring diaphragm 8, for example with several pins. The shape of the ring diaphragm 8 copies the flat shape of the wafer, whereby a slight overpressure of the neutral gas on the inside of the diaphragm prevents the etching gas from affecting the top of the wafer as a result of small leaks. Finally, the form and size of the ring diaphragm also determines the area on the wafer from the edge that is additionally to be free of etching.

It is true that contact with the front of the wafer in the (non-active) edge area of the wafer is a very common procedure (for example, clamp rings for He-cooling of a rear side in an RIE process). Nevertheless, because of the possibility of defective seals, the smallest possible seating surface and/or a non-contact method would be preferred. Two possibilities therefor are illustrated in FIG. 2 and FIG. 3.

According to FIG. 2, the wafer is held away from the diaphragm over a defined gap (approximately 0.1 mm) by using several wedge-shaped spacer projections or holding pins 9. With slight overpressure inside the diaphragm 8, a flow of gas also occurs in this case which prevents the penetration of reactive particles into the area above the wafer.

Figure 3:
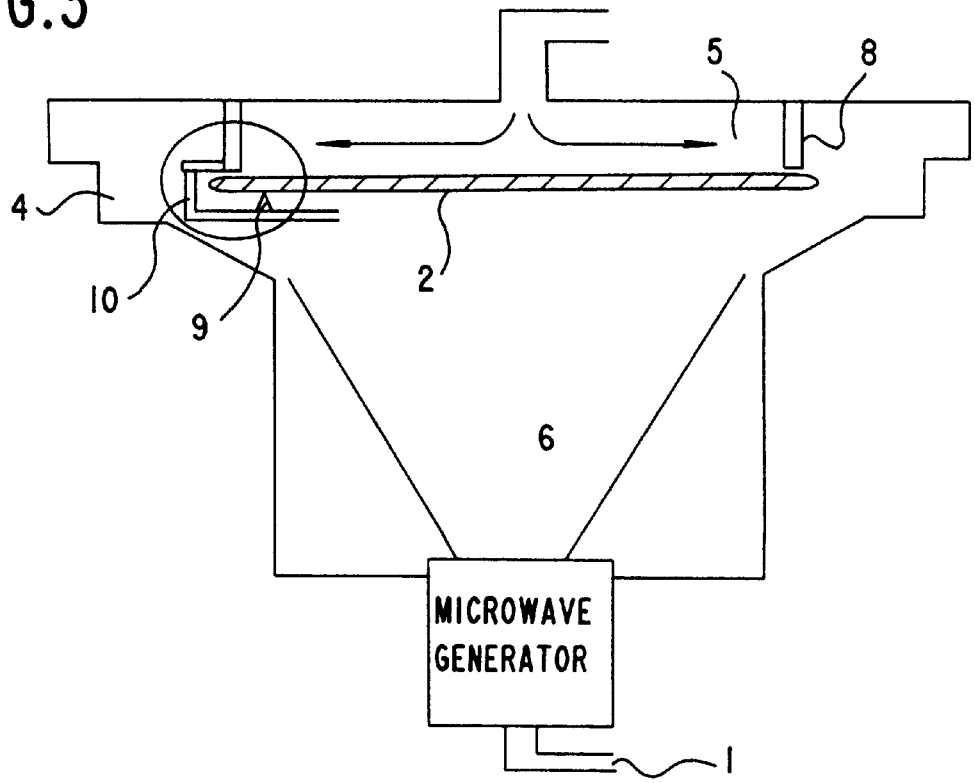
FIG. 3 is a view similar to FIG. 1 of another embodiment of a seal for a single-wafer etching system.

FIG. 3 shows the way in which this gap can be adjusted to be completely contact-free for the front side through an indirect limit stop 10.

According to the invention, the layers are also removed at the seating points of the holding pins 9 during an isotropic etching process. However, if required, the wafer can be held by round pins 11 at the points in the edge of the wafer itself, so that in combination with an indirect limit stop on the edge of the wafer, contact with the wafer during etching can be with either the top or the bottom.

The following are given as typical parameters for the back etching of a 200 nm thick polysilicon layer on thermal oxide:

| Top of wafer | $N_2$-flux | 5,000 sccm |
|---|---|---|
| | Pressure | 1.8 torr |
| Back of wafer | $CF_4$-flux | 100 sccm |
| | $O_2$-flux | 50 sccm |
| | Pressure | 1.5 torr |
| Microwave output | | 800 w |
| Etching time | | 1 min |

I claim:

1. An assembly for the manufacture of highly-integrated circuits on a semiconductor substrate, comprising:

a wafer of semiconductor material, said wafer having coated front and back sides; and a process chamber having a sloped seating area for said wafer;

said wafer being supported by and resting directly on said sloped seating area in said process chamber so as to define a first portion of said process chamber in which said front side of said wafer is subjected to a neutral gas and a second portion of said process chamber in which said back side of said wafer is etched by subjecting said back side to reactive particles produced in a plasma and to separate and isolate said first portion from said second portion of said process chamber.

2. The assembly according to claim 1, wherein said wafer has a given wafer profile on a flat side thereof, and said sloped seating area has a given cross section adapted to said wafer profile.

3. The assembly according to claim 1, wherein pressure of said neutral gas is at least as great as pressure of said plasma, such that said wafer is retained on said sloped seating area.

4. The assembly according to claim 1, including a ring pipe communicating with said first portion of said process chamber for aspirating off the neutral gas from an edge of said wafer.

5. The assembly according to claim 1, wherein said second portion of said process chamber has an annular gap formed therein below an edge of said wafer, said annular gap being provided for aspirating from said process chamber reactive particles and etching products.

6. The assembly according to claim 1, wherein said wafer is etched in said process chamber with said front side oriented horizontally and facing upwardly.

* * * * *